(12) United States Patent
Matsumoto

(10) Patent No.: US 6,373,287 B1
(45) Date of Patent: Apr. 16, 2002

(54) INPUT/OUTPUT CONTROL CIRCUIT AND MICROCOMPUTER

(75) Inventor: Hirotsugu Matsumoto, Hyogo (JP)

(73) Assignees: Mitsubishi Denki Kabushiki Kaisha, Tokyo; Mitsubishi Electric System LSI Design Corporation, Itami, both of (JP)

( * ) Notice: Subject to any disclaimer, the term of this patent is extended or adjusted under 35 U.S.C. 154(b) by 0 days.

(21) Appl. No.: 09/630,819

(22) Filed: Aug. 2, 2000

(30) Foreign Application Priority Data

Aug. 9, 1999 (JP) ............................................. 11-225236

(51) Int. Cl.$^7$ ......................................... H03K 19/0175
(52) U.S. Cl. ............................... 326/87; 326/86; 326/83
(58) Field of Search ............................... 326/82, 83, 87, 326/86

(56) References Cited

U.S. PATENT DOCUMENTS 4,680,487 A * 7/1987 Kobayahi .................. 307/475
6,008,669 A * 12/1999 Gerner ....................... 326/87

FOREIGN PATENT DOCUMENTS

JP 2-110680 4/1990

* cited by examiner

*Primary Examiner*—Michael Tokar
*Assistant Examiner*—Anh Tran
(74) *Attorney, Agent, or Firm*—Burns, Doane, Swecker & Mathis, LLP

(57) ABSTRACT

An input/output control circuit includes an input/output terminal, a first and second transistors configuring a CMOS circuit, a third transistor for carrying out a pull-up operation, an input control gate, an output control gate, a direction register for determining the direction of input/output direction, a control register for determining the mode of input or output, and a selection circuit connected to the gates for the first, second and third transistors, to the control terminals for the control gates, to the control register and also to the direction register. Since there is no redundant registers in this circuit construction, the whole size of the circuit can be made small, resulting in a reduction of total cost.

17 Claims, 5 Drawing Sheets

FIG.5

| DIRECTION REGISTER \ CONTROL REGISTER | 0 | 1 |
|---|---|---|
| 0 | NON PULL-UP PORT INPUT | PULL-UP PORT INPUT |
| 1 | SPECIFIC-SIGNAL OUTPUT | CMOS PORT OUTPUT |

FIG.8
(PRIOR ART)

| PULL UP REGISTER/ OUTPUT CONTROL REGISTER \ DIRECTION REGISTER | 00 | 01 | 11 | 10 |
|---|---|---|---|---|
| 0 | NON PULL-UP PORT INPUT | SPECIFIC-SIGNAL OUTPUT | X | PULL-UP PORT INPUT |
| 1 | CMOS PORT OUTPUT | X | X | X |

X · · · INVALID COMBINATION

INPUT/OUTPUT CONTROL CIRCUIT AND MICROCOMPUTER

BACKGROUND OF THE INVENTION

1. Field of the Invention

The present invention relates to an input/output control circuit employing MOSFET transistors, and also relates to a microcomputer containing the input/output control circuit therein.

2. Description of the Related Art

FIG. 7 is a block diagram showing the conventional input/output control circuit for use in a microcomputer or the like. In the figure, reference numeral 31 denotes a voltage source having a voltage level VCC, numeral 32 denotes a ground portion having a voltage level VSS, 33 denotes an output P-channel transistor (hereinafter may be referred to just as a "P-channel transistor"), 34 denotes a an output N-channel transistor (hereinafter may be referred to just as an "N-channel transistor"), 35 denotes a pull-up P-channel transistor, 36 denotes an input/output terminal, 37 and 38 denote NAND gates, 39 denotes a NOR gate, 40 and 41 denote inverters, 42 denotes an input control gate, 43 denotes an output control gate, 44 denotes a pull-up control register, 45 denotes a direction register, 46 denotes a port latch, 47 denotes an output control register and numeral 48 denotes a data bus. Here, the pull-up control register 44, the direction register 45, the port latch 46 and the output control register 47 are all one-bit registers in which data can be written by way of the data bus 48.

The operation of the input/output control circuit of the above configuration is now explained below.

In the case where the input/output control circuit shown in FIG. 7 is used only as an input port (this mode of use may be referred to just as a "non pull-up port input" hereinafter), first "0" is written into the direction register 45. Since an output signal from the direction register 45 is of the "L" level, an "H" level signal is output from the NAND gate 38, whereas since an "H" level signal is input to the NOR gate 39 by way of the inverter 40, an "L" level signal is output from the NOR gate 39. Subsequently, the P-channel transistor 33 and the N-channel transistor 34 are set to OFF, and the input/output terminal 36 is thus set to a high impedance state. In this state, if an "H" level or an "L" level voltage is externally applied to the input/output terminal 36, the corresponding signal is transmitted to the data bus by way of the input control gate 42, and transmitted further to the inner circuit (not shown).

Next, in the case where not only the input/output control circuit shown in FIG. 7 is used as an input port, but is used also for pulling up the input signal (this mode of use may be referred to just as a "pull-up port input" hereinafter), "1" is first written into the pull-up control register 44. In this case, since the P-channel transistor 35 is set to ON by way of the NAND gate 37, the input/output terminal is pulled up to the VCC level. Here, if the output mode of an external circuit (not shown) connected to the input/output terminal 36 is an N-channel open drain or the like, then the external circuit is set either in the "L" level or in the high-impedance state. When the external circuit is set in the high-impedance state, the potential of the input/output control terminal 36 is pulled up to the level of the VCC by the P-channel transistor 35. This "H" level signal is transmitted to the data bus by way of the input control gate 42, and is further transmitted to the internal circuit. On the other hand, when an "L" level signal is input from the external circuit, the operation of the input/output control circuit is same as that of the aforementioned case in which it is used as an input port without the pull-up operation.

Next, in the case where the input/output control circuit is used as an output port of a CMOS circuit (this mode of use may be referred to just as a "CMOS-port output" hereinafter), first "1" is written into the direction register 45. In this case, the P-channel transistor 35 is set to OFF by way of the NAND gate 37. Thereafter, the data to be output is written into the port latch 46. In this state, if "0" is written into the port latch 46, the P-channel transistor 33 is set to OFF and the N-channel transistor 34 is set to ON by way of the NAND gate 38, the NOR gate 39 and the inverter 40, so that the input/output terminal 36 outputs a VSS-level voltage. On the other hand, if "1" is written into the port latch 46, the P-channel transistor 33 is set to ON and the N-channel transistor 34 is set to OFF by way of the same NAND gate 38, the NOR gate 39 and the inverter 40, so that the input/output terminal 36 outputs a VCC-level voltage.

Next, in the case where the input/output control circuit is used as an output port for a specified signal instead of being used as the CMOS-port output (this mode of use may be referred to just as a "specified-signal output" hereinafter), it is necessary to write "0" in the direction register, "0" in the pull-up control register, and "1" in the output control register.

In consideration of all this above, FIG. 8 shows the combinations of the logics set in the pull-up control register, in the direction register and in the output control register of the input/output control circuit shown in FIG. 7, together with the mode of use formed by each of the combinations. Since 3 bits in total can be set by these registers, the number of possible combinations is as many as $2^3$, namely 8 combinations. Among these 8 combinations, efficiently used combinations are those corresponding to the above-mentioned 4 cases; namely the non pull-up port input, the pull-up port input, the CMOS-port output and the specified-signal output, so that the other 4 combinations are invalid.

Since the conventional input/output control circuit is configured as such, circuit configuration as a whole contains redundancy as invalid combinations are contained therein. Thus, there has been a problem that the redundancy contained therein makes the whole size of the circuit larger, resulting in a low cost performance. These defects are made more obvious when a plurality of ports each composed of an input/output control circuit of the same configuration are incorporated in one semiconductor chip, and the total redundancy is thus enlarged as a whole.

SUMMARY OF THE INVENTION

The present invention has been proposed to solve the problems aforementioned, and it is an object of the present invention to provide an input/output control circuit having same functions as those of the conventional circuit, but of a small size with high efficiency, by removing the redundant portions of the same circuit.

The input/output control circuit according to a first aspect of the present invention is constructed in such a manner that it comprises: a first transistor connected between the input/output terminal and a voltage source, a second transistor connected between the input/output terminal and a ground portion, a third transistor connected between the input/output terminal and the voltage source, in parallel with the first transistor, an input control gate connected to the input/output terminal for controlling transmission of input signals, an output control gate connected to the input/output terminal for controlling transmission of specific signals, a direction register for determining the direction indicating as to which of input and output operation is to be performed, a control register for determining the mode of input or output, and a selection circuit, which is connected to the gates respectively of the first transistor, the second transistor, and of the third transistor, the control terminals respectively of the input control gate and the output control gate, the direction register, and also connected to the control register.

The input/output control circuit according to another aspect of the present invention is constructed such that when a value indicating a signal input direction is input to the direction register and a value indicating a non pull-up input is input to the control register, the selection circuit outputs signals for setting the first, second, and third transistors to OFF, setting the input control gate to ON, and for setting the output control gate to OFF.

The input/output control circuit according to another aspect of the present invention is constructed such that when a value indicating a signal input direction is input to the direction register and a value indicating a pull-up input is input to the control register, the selection circuit outputs signals for setting the first and second transistors to OFF, the third transistor to ON, the input control gate to ON, and for setting the output control gate to OFF.

The input/output control circuit according to another aspect of the present invention is constructed such that when a value indicating a signal output direction is input to the direction register and a value indicating a CMOS-port output is input to the control register, the selection circuit outputs signals for setting the third transistor, the input control gate and the output control gate to OFF, which signal further setting the first transistor to ON and the second transistor to OFF in the case where an output data is "1", and setting the first transistor to OFF and the second transistor to ON in the case where an output data is "0".

The input/output control circuit according to further aspect of the present invention is constructed such that when a value indicating a signal output direction is input to the direction register and a value indicating output of a specific signal is input to the control register, the selection circuit outputs signals for setting the first, second and third transistors and also the input control gate to OFF, and for setting the output control gate to ON.

The input/output control circuit according to still further aspect of the present invention is constructed such that when a value indicating a signal input direction is input to the direction register and a value indicating a non pull-up input is input to the control register, the selection circuit outputs signals for setting the first, second, and third transistors to OFF, setting the input control gate to ON, and for setting the output control gate to OFF, when a value indicating a signal input direction is input to the direction register and a value indicating a pull-up input is input to the control register, the selection circuit outputs signals for setting the first and second transistors to OFF, the third transistor to ON, the input control gate to ON, and for setting the output control gate to OFF, when a value indicating a signal output direction is input to the direction register and a value indicating a CMOS-port output is input to the control register, the selection circuit outputs signals for setting the third transistor, the input control gate and the output control gate to OFF, which signals further setting the first transistor to ON and the second transistor to OFF in the case where an output data is "1", and setting the first transistor to OFF and the second transistor to ON in the case where an output data is "0", and when a value indicating a signal output direction is input to the direction register and a value indicating a specific-signal output is input to the control register, the selection circuit outputs signals for setting the first, second and third transistors and also the input control gate to OFF, and for setting the output control gate to ON.

A microcomputer according to the present invention is composed of one chip equipped with a plurality of input/output control circuits, wherein each of the input/output control circuits is composed of the same components as those of the input/output control circuit according to the first aspect of the present invention, thereby to enable 4 modes; namely the non pull-up port input, the pull-up port input, the CMOS-port output, and the specified-signal output.

BRIEF DESCRIPTION OF THE DRAWINGS

FIG. 5 is a table showing the relation between the combinations of logics set respectively in the control register and in the direction register, and the mode of use formed by each of the combinations.

FIG. 8 is a table showing the combinations of logics set in the pull-up register, the output control register and in the direction register, and the mode of use formed by each of the combinations.

DETAILED DESCRIPTION OF THE PREFERRED EMBODIMENTS

Several embodiments of the present invention are now explained below.

First Embodiment

Figure 1:
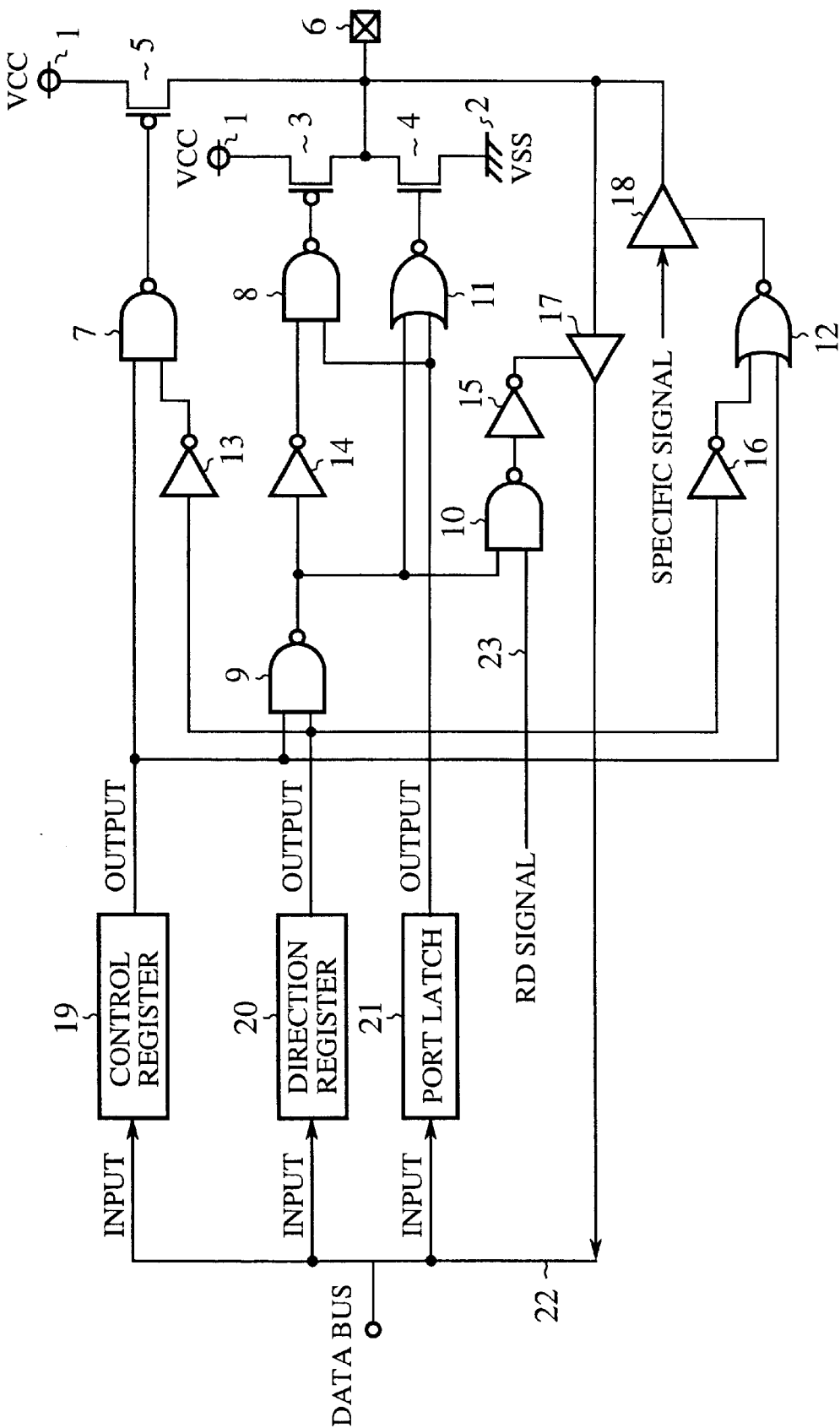
FIG. 1 is a schematic diagram showing the configuration of an input/output control circuit according to a first embodiment of the present invention.

FIG. 1 is a schematic diagram showing the configuration of the input/output control circuit according to a first embodiment of the present invention. In the figure, reference numeral 1 denotes a voltage source having a voltage level VCC, numeral 2 denotes a ground portion having a voltage level VSS, 3 denotes an output P-channel transistor (first transistor), 4 denotes an output N-channel transistor (second transistor), 5 denotes a pull-up P-channel transistor (third transistor), 6 denotes an input/output terminal, 7, 8, 9 and 10 denote NAND gates, 11 and 12 denote NOR gates, 13, 14, 15 and 16 denote inverters, 17 denotes an input control gate and 18 denotes an output control gate. Further, numeral 19 denotes a control register for controlling the input/output mode, wherein when inputting a signal, it carries out switching between a pull-up port input and a non pull-up port input, whereas when outputting a signal, it carries out switching between a CMOS-port output and a specified-signal output. Note that the "specific signal" here means any output signal other than the CMOS-port output, such as an LCD (Liquid Crystal Display) drive signal, an internal time output signal, a serial I/O output signal and so on.

Reference numeral 20 denotes a direction register for determining the input/output direction to indicate as to which of input and output operation is to be performed, 21 denotes a port latch into which a logic value to be output is written in the case of the CMOS-port output, 22 denotes a data bus and 23 denotes an RD (read) signal which becomes "H" level when the input port is read by the CPU.

Here, the control register 19, the direction register 20 and the port latch 21 are one-bit registers in which data can be written by way of the data bus 22. Further, the input control gate 17 is composed of a 3-state gate, which is set to the electrically conductive state when an "H" level signal is input to the control terminal, whereas it is set to the high-impedance state when an "L" level signal is input. The output control gate 18 is composed of a 3-state gate in the case where a specific signal is a CMOS level signal (digital signal), whereas it is composed of a transmission gate in the case where the specific signal is an analog signal (a signal whose voltage is in the intermediate level between VCC and VSS).

Here, it is considered that one selection circuit is configured from the NAND gates 7, 8, 9 and 10, the NOR gates 11 and 12, and inverters 13, 14, 15 and 16. This selection circuit is connected to the gates of the P-channel transistor 3, the N-channel transistor 4 and of the P-channel transistor 5, to the control terminals of the input control gate 17 and the output control gate 18, and also connected to the control register 19 and the direction register 20. By setting first a value in the control register 19 and the direction register 20, for example, in the case where the input/output circuit is used as an input port, a non pull-up port input can be effectuated by setting only the input control gate 17, and a pull-up port input can be effectuated by setting only the input control gate 17 and the P-channel transistor 5, both by way of the selection circuit, whereas in the case where the input/output circuit is used as an output port, if the output data is "1", by setting only the P-channel transistor 3 to ON, and if the output data is "0", by setting only the N-channel transistor 4 to ON, a CMOS-port output can be effectuated, while a specific-signal output can be effectuated by setting only the output control gate 18 to ON.

In this way, at an input/output port in a microcomputer, a double-function terminal for the CMOS-port output and the specific signal output is provided.

Figure 2:
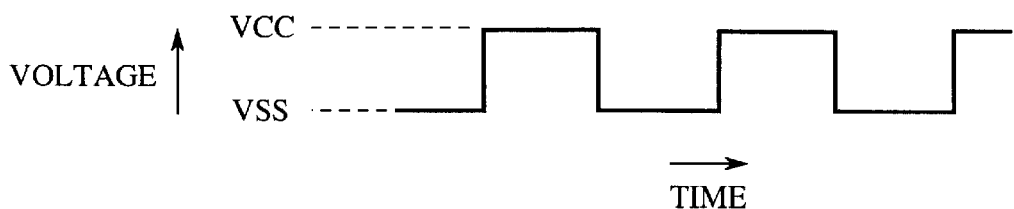
FIG. 2 is an illustration showing the waveform of a CMOS output signal.
Figure 3:
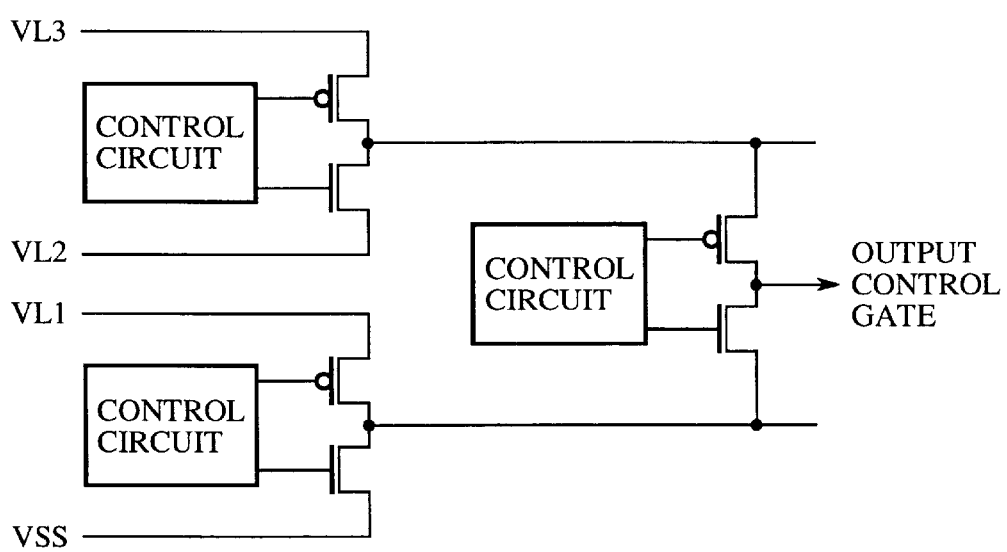
FIG. 3 is a block diagram showing the circuit for effectuating an LCD output.
Figure 4:
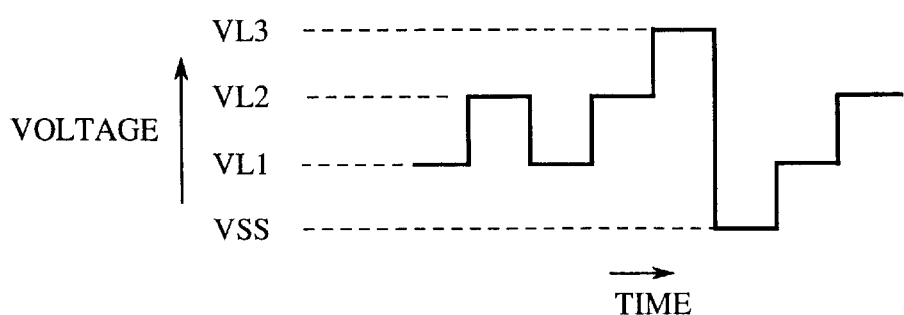
FIG. 4 is an exemplary view showing the waveform of a signal output from the circuit shown in FIG. 3.

The CMOS-output signal outputs, as shown in FIG. 2, a VCC-level voltage and a VSS-level voltage. Contrary to this, for example the LCD drive signal, which is a specific signal, has three or more output voltage levels. FIG. 3 is a block diagram showing a circuit that carries out a 1/4 bias LCD output, wherein VSS, VL1, VL2 and VL3 respectively show the voltage level for driving the LCD. FIG. 4 is an illustration showing the wave shape of a signal output from the circuit shown in FIG. 3.

The operation of the input/output control circuit of the above configuration is now explained as below.

In the case where the input/output control circuit shown in FIG. 1 is used as a non pull-up input port, "0" is first written in the control register 19, and "0" is written also in the direction register 20. In this state, the output of the inverter 13 becomes "H" level, that of the NAND circuit 7 becomes "H" level, that of the NAND circuit 9 becomes "H" level, that of the inverter 14 becomes "L" level, that of the NAND circuit 8 becomes "H" level, that of the NOR gate circuit 11 becomes "L" level, that of the inverter 16 becomes "H" level, and that of the NOR gate circuit 12 becomes "L" level. Subsequently, the P-channel transistor 3, the N-channel transistor 4, the P-channel transistor 5 and the output control gate 18 are all set to OFF. Further, In the case where the CPU reads out the input port, since the level of the RD signal 23 is "H", the output of the NAND gate circuit 10 becomes "L" level, and the output of the inverter 15 becomes "H" level. For this reason, the input control gate 17 is set to the electrically conductive state. In this state, if a signal of "L" or "H" level voltage is externally applied to the input/output terminal 6, it is transmitted to the data bus 22 through the input control gate 17, and transmitted further to the inner circuit.

Next, in the case where the input/output control circuit shown in FIG. 1 is used as a pull-up input port, "1" is first written into the control register 19, and "0" is written into the direction register 20. In this state, the output of the inverter 13 becomes "H" level, that of the NAND circuit 7 becomes "L" level, that of the NAND circuit 9 becomes "H" level, that of the inverter 14 becomes "L" level, that of the NAND circuit 8 becomes "H" level, that of the NOR gate circuit 11 becomes "L" level, that of the inverter 16 becomes "H" level, and that of the NOR gate circuit 12 becomes "L" level. Subsequently, the P-channel transistor 3, the N-channel transistor 4, and the output control gate 18 are all set to OFF, whereas the P-channel transistor 5 is set to ON, and due to this, the input/output terminal 6 is pulled up to the VCC level. Further, In the case where the CPU reads out the input port, since the level of the RD signal 23 is "H", the output of the NAND gate circuit 10 becomes "L" level, and the output of the inverter 15 becomes "H" level. For this reason, the input control gate 17 is set to the electrically conductive state. In this state, if the output mode of the external circuit (not shown) which is connected to the input/output terminal 6 is the N-channel open drain or the like, the external circuit is put in either the "L" level output or in the high impedance state. In this state, if the external circuit is put in the high impedance state, the potential of the input/output terminal 6 is pulled up to the VCC level by the P-channel transistor 5. This "H" level signal is transmitted to the data bus 22 by way of the input control gate 17, and transmitted further to the inner circuit. On the other hand, if an "L" level signal is input from the external circuit, the operation of the input/output control circuit is same as that of the aforementioned case in which it is used as an input port without the pull-up operation.

Next, in the case where the input/output control circuit shown in FIG. 1 is used as a CMOS-output port, first "1" is written into the control register 19, and "0" is written into the direction register 20. In this state, the output of the inverter 13 becomes "L" level, that of the NAND circuit 7 becomes "H" level, that of the NAND circuit 9 becomes "L" level, that of the inverter 14 becomes "H" level, that of the NAND circuit 10 becomes "H" level, that of the inverter 15 becomes "L" level, that of the inverter 16 becomes "L" level and that of the NOR gate circuit 12 becomes "L" level. Subsequently, the P-channel transistor 5, the input control gate 17 and the output control gate 18 are all set to OFF, and thereafter the data to be output is written into the port latch 21. In this state, if "0" is written into the port latch 21, the output of the NAND gate 8 becomes "H" level, and that of the NAND gate 11 becomes "H" level. Subsequently, since the P-channel transistor 3 is set to OFF, and the N-channel transistor 4 is set to ON, the input/output control terminal 6 outputs a VSS-level voltage. On the other hand, if "1" is written into the port latch 21, the output of the NAND gate 8 becomes "L" level, and that of the NAND gate 11 becomes "L" level. Subsequently, since the P-channel transistor 3 is set to ON, and the N-channel transistor 4 is set to OFF, the input control terminal 6 outputs a VCC-level voltage.

Next, in the case where the input/output control circuit shown in FIG. 1 is used as a specific-signal output port, "0" is written into the control register 19, and "1" is written also into the direction register 20. In this state, the output of the inverter 13 becomes "L" level, that of the NAND circuit 7 becomes "H" level, that of the NAND circuit 9 becomes "H" level, that of the inverter 14 becomes "L" level, that of the NAND gate 8 becomes "H" level, and that of the NOR gate 11 becomes "L" level. Subsequently, the P-channel transistor 3, the N-channel transistor 4 and the P-channel transistor 5 are all set to OFF. Since a specific signal is being output, the RD signal 23 is in the "L" level, so that the output of the NAND gate 10 becomes "H" level, and that of the inverter 15 becomes "L" level, and thus, the input control gate 17 is put in the OFF state. Further, since the output of the inverter 16 becomes "L" level, and that of the NOR gate 12 becomes "H" level, the output control gate 18 is put in an electrically conductive state. In this state, if a specific signal is output, this signal is externally output by way of the input control gate 18 and the input/output terminal 6.

FIG. 5 is a table showing the relation between the combinations of logics set respectively in the control register 19 and the direction register 20, and the mode of use of the input/output control circuit made by each of the combinations according to this first embodiment. As shown in FIG. 5, the 4 modes; namely the non pull-up port input, the pull-up port input, the specific signal output and of the CMOS-port output can be designated by these two registers. Further, the operating state of each case is exclusive to each other, and a plurality of operating states cannot be designated simultaneously.

As explained heretofore, according to this first embodiment, since 4 modes can be designated by the two registers, there is no redundant combination of logics set in the registers, which differs from the case of the conventional circuit. In connection with this, since the number of registers is reduced by one, in comparison with the case of the conventional circuit, functionally similar circuit can be configured efficiently.

Second Embodiment

Figure 6:
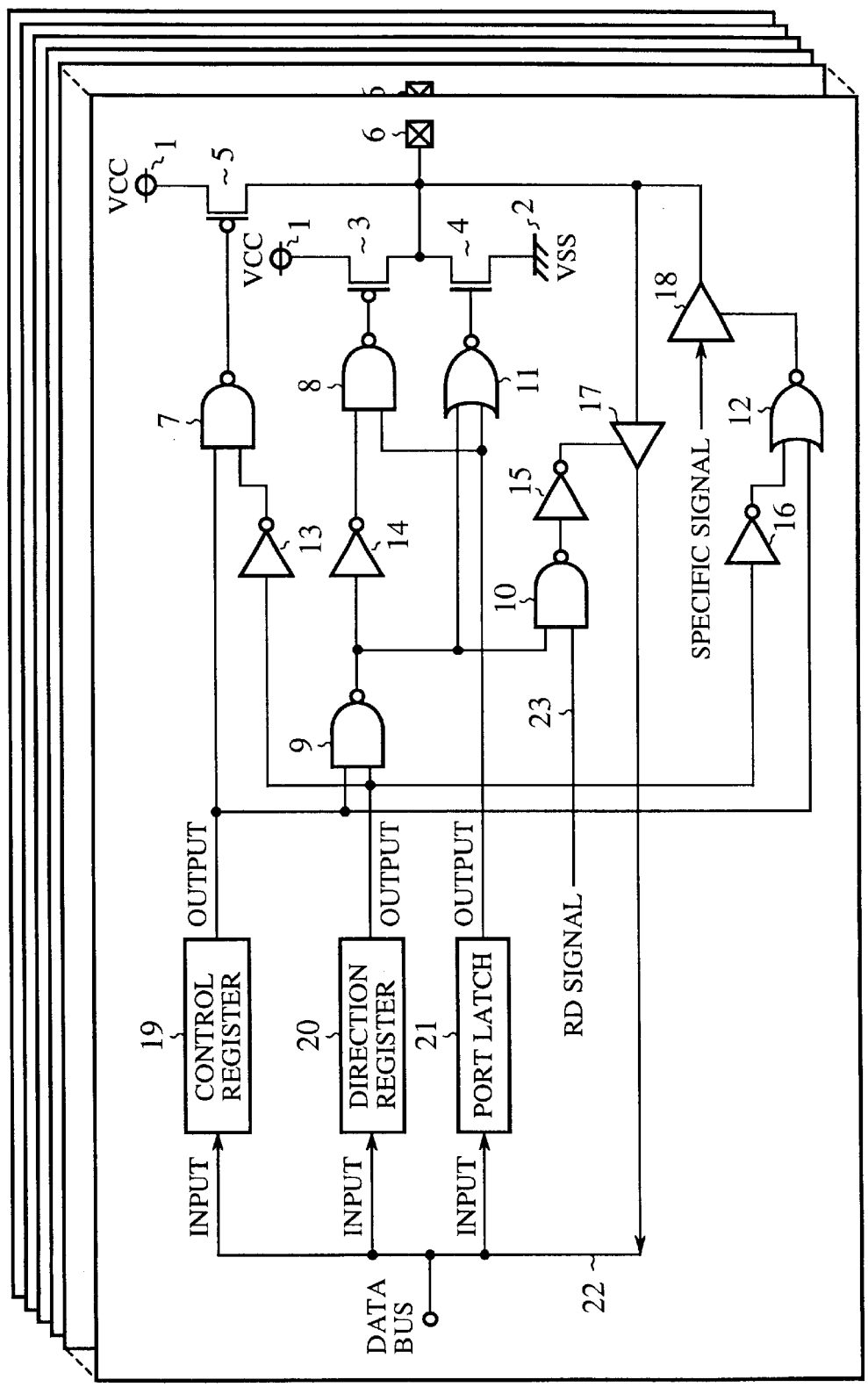
FIG. 6 is a schematic diagram showing the configuration of a microcomputer according to a second embodiment of the present invention.
Figure 7:
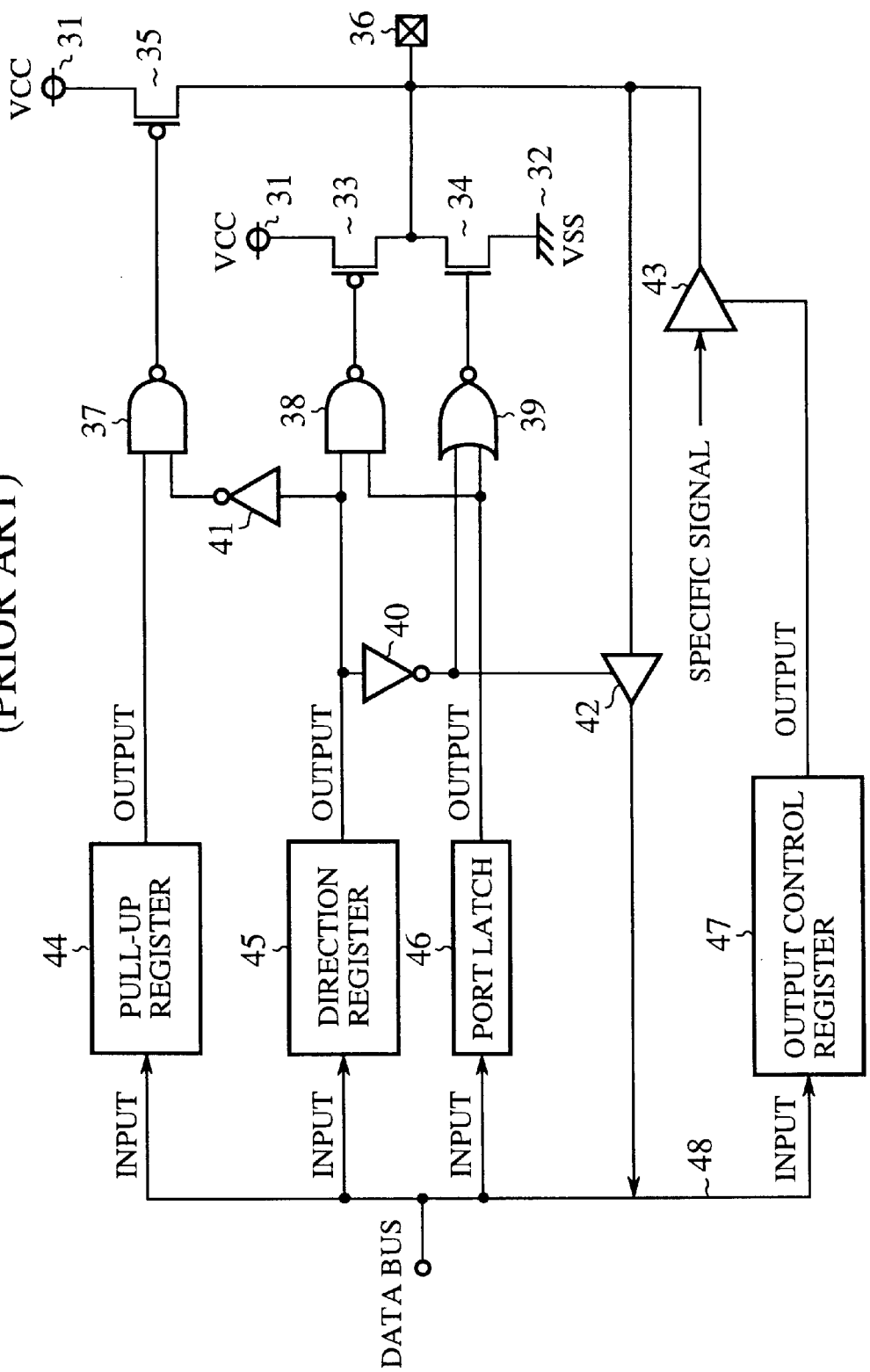
FIG. 7 is a schematic diagram showing the configuration of a conventional input/output control circuit.

FIG. 6 is a schematic diagram showing the configuration of a microcomputer according to a second embodiment of the present invention, wherein the microcomputer contains therein terminals having dual function of outputting a specified signal such as, for example, an LCD drive signal, and of an input/output port. The microcomputer shown in FIG. 6 stores therein a plurality of input/output control circuits of the first embodiment shown in FIG. 1, wherein when it is operated as, for example, an LCD drive signal, each of the terminals corresponds to a segment output or a common output. Further, each terminal can switch the 4 modes; namely the non pull-up port input, pull-up port input, specific signal output and CMOS-port output.

As explained above, according to the second embodiment of the present invention, since a microcomputer is equipped with a plurality of input/output control circuits without redundant logic combinations, the whole size of the circuit can be made small.

As explained heretofore, the input/output control circuit according to the first aspect of the present invention is constructed in such a manner that it comprises: a first transistor connected between the input/output terminal and a voltage source, a second transistor connected between the input/output terminal and a ground portion, a third transistor connected between the input/output terminal and the voltage source, in parallel with the first transistor, an input control gate connected to the input/output terminal for controlling transmission of input signals, an output control gate connected to the input/output terminal for controlling transmission of specific signals, a direction register for determining the direction indicating as to which of input and output operation is to be performed, a control register for determining the mode of input or output, and a selection circuit, which is connected to the gates respectively of the first transistor, the second transistor, and of the third transistor, the control terminals respectively of the input control gate and the output control gate, the direction register, and also connected to the control register, wherein the first transistor that is a P-channel transistor and the second transistor that is an N-channel transistor configure together a CMOS circuit, and due to this construction, an input/output control circuit capable of switching 4 modes; namely the pull-up port input, the non pull-up port input, the CMOS-port output and the specific-signal output can be obtained by appropriately controlling the selection circuit.

The input/output control circuit according to the present invention is constructed such that when a value indicating a signal input direction to the direction register is input and a value indicating a non pull-up input to the control register is input, the selection circuit outputs signals for setting the first, second, and third transistors to OFF, setting the input control gate to ON, and for setting the output control gate to OFF, and due to this construction, an input/output control circuit capable of effectuating the non pull-up port input can be obtained.

The input/output control circuit according to the present invention is constructed such that when a value indicating a signal input direction to the direction register is input and a value indicating a pull-up input to the control register is input, the selection circuit outputs signals for setting the first and second transistors to OFF, the third transistor to ON, the input control gate to ON, and for setting the output control gate to OFF, and due to this construction, and due to this construction, the input/output control circuit capable of effectuating the pull-up port input can be obtained.

The input/output control circuit according to the present invention is constructed such that when a value indicating a signal output direction to the direction register is input and a value indicating a CMOS-port output to the control register is input, the selection circuit outputs signals for setting the third transistor, the input control gate and the output control gate to OFF, which signal further setting the first transistor to ON and the second transistor to OFF when an output data is "1", and setting the first transistor to OFF and the second transistor to ON when an output data is "0", and due to this construction, the input/output control circuit capable of effectuating the CMOS-port output can be obtained.

The input/output control circuit according to the present invention is constructed such that when a value indicating a signal output direction to the direction register is input and a value indicating output of a specific signal to the control register is input, the selection circuit outputs signals for setting the first, second and third transistors and also the input control gate to OFF, and for setting the output control gate to ON, and due to this construction, the input/output control circuit capable of effectuating the specific-signal output can be obtained.

The input/output control circuit according to the present invention is constructed such that when a value indicating a signal input direction to the direction register is input and a value indicating a non pull-up input to the control register is input, the selection circuit outputs signals for setting the first, second, and third transistors to OFF, setting the input control gate to ON, and for setting the output control gate to OFF, when a value indicating a signal input direction to the direction register is input and a value indicating a pull-up input to the control register is input, the selection circuit outputs signals for setting the first and second transistors to OFF, the third transistor to ON, the input control gate to ON, and for setting the output control gate to OFF, when a value indicating a signal output direction to the direction register is input and a value indicating a CMOS-port output to the control register is input, the selection circuit outputs signals for setting the third transistor, the input control gate and the output control gate to OFF, which signals further setting the first transistor to ON and the second transistor to OFF when an output data is "1", and setting the first transistor to OFF and the second transistor to ON when an output data is "0", and when a value indicating a signal output direction to the direction register is input and a value indicating a specific-signal output to the control register is input, the selection circuit outputs signals for setting the first, second and third transistors and also the input control gate to OFF, and for setting the output control gate to ON. Due to this construction, 4 modes; namely the non pull-up port input, the pull-up port input, the CMOS-port input and the specific-signal output can be effectuated, and these 4 modes can be specified by only two registers, namely the direction register and the control register, so that no redundant combinations of logics can be observed, and thus a circuit having the same function as the conventional one can be implemented efficiently.

Still further, a microcomputer according to the present invention is composed of one chip equipped with a plurality of input/output control circuits, wherein each of the input/output control circuits is composed of the same components as those of the input/output control circuit according to the first aspect of the present invention, and due to this, a microcomputer of a small-size circuit without redundant portions can be obtained.

What is claimed is:

1. An input/output control circuit comprising:
    an input/output terminal,
    a first transistor connected between said input/output terminal and a voltage source,
    a second transistor connected between said input/output terminal and a ground portion,
    a third transistor connected between said input/output terminal and said voltage source, in parallel with said first transistor,
    an input control gate connected to said input/output terminal for controlling transmission of input signals,
    an output control gate connected to said input/output terminal for controlling transmission of specific signals,
    a direction register for determining the direction indicating as to which of input and output operation is to be performed,
    a control register for determining the mode of input or output, and
    a selection circuit, which is connected to the gates respectively of said first transistor, said second transistor, and of said third transistor, the control terminals respectively of said input control gate and said output control gate, said direction register, and also connected to said control register.

2. An input/output control circuit according to claim 1, wherein when a value indicating a signal input direction is input to said direction register and a value indicating a non pull-up input is input to said control register, said selection circuit outputs signals for setting said first, second, and third transistors to OFF, setting said input control gate to ON, and for setting said output control gate to OFF.

3. An input/output control circuit according to claim 1, wherein when a value indicating a signal input direction is input to said direction register and a value indicating a pull-up input is input to said control register, said selection circuit outputs signals for setting said first and second transistors to OFF, said third transistor to ON, said input control gate to ON, and for setting said output control gate to OFF.

4. An input/output control circuit according to claim 1, wherein when a value indicating a signal output direction is input to said direction register and a value indicating a CMOS-port output is input to said control register, said selection circuit outputs signals for setting said third transistor, said input control gate and said output control gate to OFF, said signal further setting said first transistor to ON and said second transistor to OFF in the case where an output data is "1", and setting said first transistor to OFF and said second transistor to ON in the case where an output data is "0".

5. An input/output control circuit according to claim 1, wherein when a value indicating a signal output direction is input to said direction register and a value indicating output of a specific signal is input to said control register, said selection circuit outputs signals for setting said first, second and third transistors and also said input control gate to OFF, and for setting said output control gate to ON.

6. An input/output control circuit according to claim 5, wherein said specific signal means an output signal other than the signal output from said CMOS circuit.

7. An input/output control circuit according to claim 1, wherein when a value indicating a signal input direction is input to said direction register and a value indicating a non pull-up input is input to said control register, said selection circuit outputs signals for setting said first, second, and third transistors to OFF, setting said input control gate to ON, and for setting said output control gate to OFF, when a value indicating a signal input direction is input to said direction register and a value indicating a pull-up input is input to said control register, said selection circuit outputs signals for setting said first and second transistors to OFF, said third transistor to ON, said input control gate to ON, and for setting said output control gate to OFF, when a value indicating a signal output direction is input to said direction register and a value indicating a CMOS-port output is input to said control register, said selection circuit outputs signals for setting said third transistor, said input control gate and said output control gate to OFF, said signals further setting said first transistor to ON and said second transistor to OFF in the case where an output data is "1", and setting said first transistor to OFF and said second transistor to ON in the case where an output data is "0", and when a value indicating a signal output direction is input to said direction register and a value indicating output of a specific signal is input to said control register, said selection circuit outputs signals for setting said first, second and third transistors and also said input control gate to OFF, and for setting said output control gate to ON.

8. An input/output control circuit according to claim 7, wherein said specific signal means an output signal other than the signal output from said CMOS circuit.

9. A microcomputer composed of one chip equipped with a plurality of input/output control circuits, wherein each of said input/output control circuits comprises:
   an input/output terminal,
   a first transistor connected between said input/output terminal and a voltage source,
   a second transistor connected between said input/output terminal and a ground portion,
   a third transistor connected between said input/output terminal and said voltage source, in parallel with said first transistor,
   an input control gate connected to said input/output terminal for controlling transmission of input signals,
   an output control gate connected to said input/output terminal for controlling transmission of specific signals,
   a direction register for determining the direction indicating as to which of input and output operation is to be performed,
   a control register for determining the mode of input or output, and
   a selection circuit, which is connected to the gates respectively of said first transistor, said second transistor, and of said third transistor, the control terminals respectively of said input control gate and said output control gate, said direction register, and also connected to said control register.

10. A microcomputer according to claim 9, wherein when a value indicating a signal input direction is input to said direction register and a value indicating a non pull-up input is input to said control register, said selection circuit in the input/output control circuit outputs signals for setting said first, second, and third transistors to OFF, setting said input control gate to ON, and for setting said output control gate to OFF.

11. A microcomputer according to claim 9, wherein when a value indicating a signal input direction is input to said direction register and a value indicating a pull-up input is input to said control register, said selection circuit in the input/output control circuit outputs signals for setting said first and second transistors to OFF, said third transistor to ON, said input control gate to ON, and for setting said output control gate to OFF.

12. A microcomputer according to claim 9, wherein when a value indicating a signal output direction is input to said direction register and a value indicating a CMOS-port output is input to said control register, said selection circuit in the input/output control circuit outputs signals for setting said third transistor, said input control gate and said output control gate to OFF, said signal further setting said first transistor to ON and said second transistor to OFF in the case where an output data is "1", and setting said first transistor to OFF and said second transistor to ON in the case where an output data is "0".

13. A microcomputer according to claim 9, wherein when a value indicating a signal output direction is input to said direction register and a value indicating output of a specific signal is input to said control register, said selection circuit in the input/output control circuit outputs signals for setting said first, second and third transistors and also said input control gate to OFF, and for setting said output control gate to ON.

14. A microcomputer according to claim 13, wherein said specific signal means an output signal other than the signal output from said CMOS circuit.

15. A microcomputer according to claim 9, wherein when a value indicating a signal input direction is input to said direction register and a value indicating a non pull-up input is input to said control register, said selection circuit in the input/output control circuit outputs signals for setting said first, second, and third transistors to OFF, said input control gate to ON, and for setting said output control gate to OFF,
   when a value indicating a signal input direction is input to said direction register and a value indicating a pull-up input is input to said control register, said selection circuit in the input/output control circuit outputs signals for setting said first and second transistors to OFF, setting said third transistor to ON, said input control gate to ON, and for setting said output control gate to OFF,
   when a value indicating a signal output direction is input to said direction register and a value indicating a CMOS-port output is input to said control register, said selection circuit in the input/output control circuit outputs signals for setting said third transistor, said input control gate and said output control gate to OFF, said signals further setting said first transistor to ON and said second transistor to OFF in the case where an output data is "1", and setting said first transistor to OFF and said second transistor to ON in the case where an output data is "0", and
   when a value indicating a signal output direction is input to said direction register and a value indicating output of a specific signal is input to said control register, said selection circuit in the input/output control circuit outputs signals for setting said first, second and third transistors and also said input control gate to OFF, and for setting said output control gate to ON.

16. An input/output control circuit comprising:
   an input/output terminal,
   a first transistor connected between said input/output terminal and a voltage source,
   a second transistor connected between said input/output terminal and a ground portion,
   a third transistor connected between said input/output terminal and said voltage source, in parallel with said first transistor,
   an input control gate connected to said input/output terminal for controlling transmission of input signals,
   an output control gate connected to said input/output terminal for controlling transmission of specific signals,
   a direction register for determining a direction indicating which of an input operation and an output operation is to be performed,
   a control register for determining a mode of input or output, and
   a selection circuit, which has outputs connected to a) gates respectively of said first transistor, said second transistor, and said third transistor, and b) control terminals respectively of said input control gate and said output control gate, and which has inputs connected to said direction register and said control register.

17. A microcomputer composed of one chip equipped with a plurality of input/output control circuits, wherein each of said input/output control circuits comprises:

an input/output terminal, a first transistor connected between said input/output terminal and a voltage source, a second transistor connected between said input/output terminal and a ground portion, a third transistor connected between said input/output terminal and said voltage source, in parallel with said first transistor, an input control gate connected to said input/output terminal for controlling transmission of input signals, an output control gate connected to said input/output terminal for controlling transmission of specific signals, a direction register for determining a direction indicating which of an input operation and an output operation is to be performed, a control register for determining a mode of input or output, and a selection circuit, which has outputs connected to a) gates respectively of said first transistor, said second transistor, and said third transistor, and b) control terminals respectively of said input control gate and said output control gate, and which has inputs connected to said direction register and said control register.

* * * * *